(12) United States Patent
Tronche et al.

(10) Patent No.: US 8,581,663 B2
(45) Date of Patent: Nov. 12, 2013

(54) MULTI-PORT AMPLIFICATION DEVICE THAT SELF-COMPENSATES IN THE PRESENCE OF TRAFFIC

(75) Inventors: Christian Tronche, Lespinasse (FR); Jean-Marc Soulie, Requista (FR)

(73) Assignee: Thales, Neuilly-sur-Seine (FR)

( * ) Notice: Subject to any disclaimer, the term of this patent is extended or adjusted under 35 U.S.C. 154(b) by 0 days.

(21) Appl. No.: 13/504,601

(22) PCT Filed: Oct. 20, 2010

(86) PCT No.: PCT/EP2010/065775
§ 371 (c)(1),
(2), (4) Date: Jun. 14, 2012

(87) PCT Pub. No.: WO2011/051146
PCT Pub. Date: May 5, 2011

(65) Prior Publication Data
US 2012/0280748 A1    Nov. 8, 2012

(30) Foreign Application Priority Data

Oct. 27, 2009   (FR) ...................................... 09 05164

(51) Int. Cl.
*H03F 3/68* (2006.01)
(52) U.S. Cl.
USPC ......................................... 330/124 R; 330/84
(58) Field of Classification Search
USPC .......................... 330/53, 84, 124 R, 286, 295
See application file for complete search history.

(56) References Cited

U.S. PATENT DOCUMENTS

| | | | |
|---|---|---|---|
| 5,834,972 A * | 11/1998 | Schiemenz et al. | 330/124 R |
| 6,006,111 A * | 12/1999 | Rowland | 455/561 |
| 6,243,038 B1 | 6/2001 | Butler et al. | |
| 6,661,284 B1 * | 12/2003 | Luz et al. | 330/124 R |
| 7,088,173 B1 | 8/2006 | Rozario et al. | |
| 7,139,539 B2 * | 11/2006 | Chun | 455/127.1 |
| 8,099,056 B2 * | 1/2012 | Honcharenko | 455/67.11 |
| 2002/0168949 A1 | 11/2002 | Johannisson et al. | |
| 2008/0143562 A1 | 6/2008 | Huang et al. | |
| 2011/0267141 A1 * | 11/2011 | Hangai et al. | 330/84 |

FOREIGN PATENT DOCUMENTS

| | | |
|---|---|---|
| JP | 2005-269043 A | 9/2005 |
| WO | 20081135753 A1 | 11/2008 |
| WO | 20091080752 A1 | 7/2009 |

* cited by examiner

*Primary Examiner* — Khanh V Nguyen
(74) *Attorney, Agent, or Firm* — Baker & Hostetler LLP

(57) ABSTRACT

A system for multi-distributed amplification of a communication signal including at least one plurality N of input pathways connected to an input Butler matrix which delivers as output N distributed signals, a plurality N of tube amplifiers which receive as input said distributed signals and produce as output N amplified and phase-shifted signals each of a complex gain Gi and an output Butler matrix which receives as input said amplified signals and produces as output N output signals, wherein the phase error and amplitude error are self-compensated in the presence of traffic.

13 Claims, 5 Drawing Sheets

MULTI-PORT AMPLIFICATION DEVICE THAT SELF-COMPENSATES IN THE PRESENCE OF TRAFFIC

CROSS-REFERENCE TO RELATED APPLICATIONS

This application is a National Stage of International patent application PCT/EP2010/065775, filed on Oct. 20, 2010, which claims priority to foreign French patent application No. FR 09 05164, filed on Oct. 27, 2009, the disclosures of each of which are incorporated by reference in their entireties.

FIELD OF THE DISCLOSED SUBJECT MATTER

The present invention relates to a multi-port amplification device known by the abbreviation MPA (Multi-Port Amplifier), also called a distributed-amplification sub-system. This type of device is commonly used in communication systems using multibeam antennas which have the capacity to form several wavebeams in various directions. In particular, satellite communication systems use this type of amplifier to flexibly distribute several transmission channels to several output beams.

BACKGROUND

One of the essential parameters of a multi-port amplifier is the isolation between the various output pathways which must be sufficient to guarantee acceptable isolation between the beams generated by the antenna. The isolation of a first output pathway in relation to a second output pathway different from the first is measured by the ratio of the maximum power of the amplified signal on the first output pathway of the multi-port amplifier to the residual power present on the second output pathway of the multi-port amplifier, this residual power being due to the imperfections of the system and also to the phenomenon of intermodulation.

A theoretical multi-port amplifier possesses infinite isolation between each of its output ports, however in practice, the Butler matrices and the amplification chains used within such an amplifier are not ideal and exhibit imperfections which may give rise to amplitude and phase errors which ultimately have an impact on the isolation of each of the output pathways in relation to the others. This phenomenon has notably all the more impact the higher the carrier frequency used. In view of these limitations, it is therefore necessary to produce a solution making it possible to correct the amplitude error and phase error and therefore to improve the overall isolation of the system.

U.S. Pat. No. 7,088,173 describes a scheme making it possible to correct the phase imperfections within a multi-port amplifier. The envisaged solution uses test signals injected at various points of the input network and measured at various points of the output network so as to determine the phase errors impacting the amplifiers. This solution makes it necessary to deactivate part of the amplifiers in order to perform the various measurements required. This scheme is therefore not suited to the simultaneous implementation of a communication.

U.S. Pat. No. 6,006,111 and Japanese patent JP2005269043 also describe methods making it possible to compensate for the imperfections of a distributed-amplification system on the basis of measurements performed on one or more output pathways but these schemes use only the measurement of the amplitude without taking the phase errors into account.

International patent application WO2008135753 describes a self-compensated multi-port amplifier solution comprising 8 input pathways and 8 output pathways. The principle consists in injecting a reference signal on the first input branch of the device and then measuring the imbalance between pathways, by virtue of 7 power detectors distributed in the output matrix. Several feedback loops then act on the attenuators and the phase shifters placed upstream of the amplifiers so as to minimize the voltage detected at each of the 7 points.

The scheme described in this patent application uses an iterative method for adjusting the amplitude and the phase upstream of the amplifiers so as to converge toward a zero power value on each point of the output matrix where a power detector is positioned. This method does not seem sufficiently efficacious to ensure sufficient isolation since the isolation matrix after compensation appears degraded in comparison with the isolation matrix before compensation. The result obtained is, in particular, not compatible with the proper operation of a telecommunications satellite mission.

Finally, American patent application US20080143562 may also be cited, which proposes a compensation scheme based on a priori knowledge of the signal transmitted by modeling its probability density. Such a scheme is too restrictive since it is not adaptable to all types of signal, in particular a signal modulated by the combination of several simple modulations.

SUMMARY

In view of the limitations of the prior art, the present invention introduces a self-compensated distributed-amplification system solution with the aim of minimizing the amplitude error and phase error inherent in the imperfections of such a system. This solution makes it possible to considerably improve performance in respect of isolation between output pathways of the device and operates in the presence of traffic, that is to say without interrupting the nominal operation of the communication system implementing an amplifier according to the invention.

For this purpose the subject of the invention is a system for multi-distributed amplification of a communication signal comprising at least one plurality N of input pathways i connected to an input Butler matrix which delivers as output N distributed signals, a plurality N of amplifiers which receive as input said distributed signals and produce as output N amplified and phase-shifted signals each of a complex gain $G_i$ and an output Butler matrix which receives as input said amplified signals and produces as output N output signals, said system being characterized in that it comprises in addition:

- a generator of a reference signal of known amplitude e and of known phase, said reference signal being provided on one of said input pathways of said system, said reference signal being transmitted simultaneously with said communication signal to be amplified,
- a device for measuring the errors S of amplitude and of phase of each of said output signals of said system, said device being suitable for performing a coherent demodulation of the amplified signal so as to extract said reference signal from said communication signal and to estimate said amplitude error and phase error impacting the reference signal,
- a signal processing device receiving as input said measurements S of the amplitude error and phase error, and producing, on the basis of said measurements S, for each pathway i of said system, an amplitude compensation $a'_i$ and phase compensation $\Phi'_i$, the aim of said compensation being to minimize the differences between the complex gain $G_i$ of the amplifier of each pathway i and the complex gain $G_1$ of the amplifier of a reference pathway from among the pathways of said system, a phase/amplitude compensation device, inserted between said input Butler matrix and the plurality of amplifiers and suitable for correcting each of the pathways i of said system on the basis of the received values of amplitude compensation $a'_i$ and phase compensation $\Phi'_i$.

In a variant embodiment of the invention, said reference pathway is one of the pathways of the amplification system or a virtual pathway whose gain is equal to the average of the gains of the set of pathways of the amplification system or the pathway i exhibiting the lowest gain $G_i$ or the pathway i exhibiting the highest gain $G_i$.

In a variant embodiment of the invention, said reference signal is spread spectrally with the aid of a spreading code and said measurement device is adapted, in addition, to despread the signal received on the basis of said spreading code so as to separate the reference signal from the communication signal.

In a variant embodiment of the invention, the signal processing device determines the amplitude compensation $a'_i$ and phase compensation $\Phi'_i$ on the basis of at least the following calculation steps:

a step of calculating the complex gains $G_i$ on the basis of the following relation:

$$G_i = \frac{S_1^i}{e \cdot MB_1^i \cdot a_i \cdot e^{j\Phi_i}},$$

where $S_1^i$ is the component of index i of the vector $S_1 = MB_2^{-1} \cdot S$ with $MB^{-1}_2$ the inverse of the output Butler matrix, $MB_1^i$ is the component of index i of the first row of the input Butler matrix, $a_i$ and $\Phi_i$ are the amplitude and phase compensations obtained at an earlier instant, a step of calculating the following quantities, for each pathway of index i, $\Delta Z_{1,i} = (a_i + |G_i|) - (a_1 + |G_1|)$ and $\Delta \Phi_{1,i} = (\Phi_i + \arg(G_i)) - (\Phi_1 + \arg(G_1))$, where $|\ |$ denotes the modulus of a complex number and $\arg(\ )$ denotes its phase, the index 1 denotes the reference pathway, a step of calculating the amplitude $OBO_i$ of the signal at the output of each amplifier on the basis of said vector $S_1$, a step of calculating the amplitude compensation $a'_i$, on each pathway i, at a later instant, on the basis of said quantity $\Delta Z_{1,i}$ and of the amplitude $OBO_i$ of the output signal of the amplifier of said pathway, a step of calculating the phase compensation $\Phi'_i$ on each pathway i, at a later instant, on the basis of said quantity $\Delta \Phi_{1,i}$ according to the relation $\Phi'_i = \Phi_i - \Delta \Phi_{1,i}$ In a variant embodiment of the invention, the amplitude compensation $a'_i$ is determined at least with the aid of the following relations: $a'_i = a_i + IBO'_i - IBO_i$ where $IBO_i = f_{AM,AM}^i(OBO_i)$, $OBO'_i = OBO_i - \Delta Z_{1,i}$ and $IBO'_i = f_{AM,AM}^i(OBO'_i)$ with $f_{AM,AM}^i$ the transfer function of the tube amplifier of the pathway i which connects the input amplitude and output amplitude.

In another variant embodiment of the invention, the amplitude compensation $a'_i$ is determined at least with the aid of the following relation: $a'_i = a_i + \eta(OBO'_i - OBO_i)$ with $\eta$ a multiplicative coefficient less than 1 in absolute value and $OBO'_i = OBO_i - \Delta Z_{1,i}$.

In a variant embodiment of the invention, the phase compensation $\Phi'_i$ is determined furthermore on the basis of the following relations:

$$\Theta_i = f_{AM,PM}^i(OBO_i)$$

$$\Theta'_i = f_{AM,PM}^i(OBO'_i)$$

$$\Phi'_i = \Phi_i - \Delta \Phi_{1,i} - (\Theta'_i - \Theta_i)$$

where $f_{AM,PM}^i$ is the transfer function of the tube amplifier of the pathway i which connects the input phase to the output amplitude.

In a variant embodiment of the invention, said input Butler matrix and output Butler matrix are composed of a plurality of hybrid couplers connected together.

In a variant embodiment of the invention, said matrices $MB_1$ and $MB_2$ are obtained on the basis of measurements of the transfer functions of the input Butler matrix and output Butler matrix or on the basis of the theoretical transfer functions of the input Butler matrix and output Butler matrix.

In a variant embodiment of the invention, said measurement device is adapted, in addition, for measuring the isolation I between the reference pathway and the other output pathways of said system and a new amplitude compensation $a'_i$ and phase compensation $\Phi'_i$ is determined in an adaptive manner as soon as the value of the isolation I exceeds a given threshold.

In a variant embodiment, said amplifiers are tube amplifiers or solid-state amplifiers.

In a variant embodiment, the system according to the invention is used in a satellite communication system, said signal processing device is remotely sited in a ground facility and communicates with said system situated in an onboard facility by way of a remote control link and/or of a telemetry link.

The subject of the invention is also a use of the system according to the invention for detecting defects of the amplifiers of one of said pathways i of the system, characterized in that the components of the vector $S_1 = MB_2^- \cdot S$ are compared with a given threshold so as to detect a significant decline in power at the output of one of said amplifiers and to replace the defective amplifier.

BRIEF DESCRIPTION OF THE DRAWINGS

Other characteristics will become apparent on reading the following nonlimiting detailed description given by way of example and in relation to appended drawings which represent.

DETAILED DESCRIPTION

Figure 1:
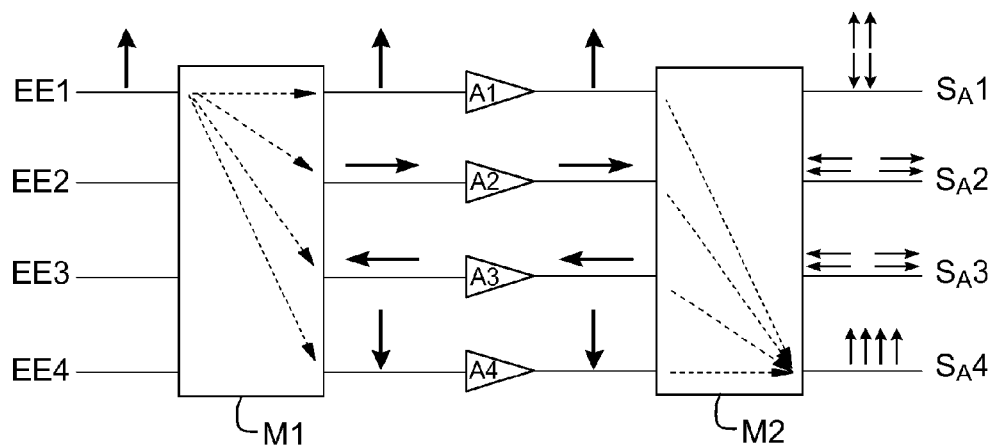
FIG. 1, a schematic of an exemplary multi-port amplifier possessing 4 inputs and 4 outputs according to the prior art, FIG. 2, a chart representing the spectrum of the composite signal injected as input to a multi-port amplifier according to the invention, FIG. 3, a diagram of a self-compensated multi-port amplifier according to the invention, FIGS. 3a and 3b, two diagrams of examples of implementation of the device for measuring the amplitude error and phase error at the output of the amplifier according to the invention, FIGS. 4a and 4b a chart of an example of transfer functions of a tube amplifier, FIG. 5, an illustration of the performance obtained before and after compensation of the isolation of an amplifier according to the invention.

FIG. 1 shows diagrammatically an exemplary multi-port amplifier according to the prior art. This amplifier is composed of an input matrix M1 with 4 inputs E1,E2,E3,E4. These 4 inputs are available to receive 4 distinct signals, for example transmitted on 4 different frequency tracks. The input matrix M1, for example a Butler matrix, typically comprises three series of four hybrid couplers placed in cascade. The function of the input matrix M1 is to distribute a signal dispatched for example on the input E1 to the four output branches. On each output of said matrix, a progressive phase shift is applied. The first output is not phase-shifted, the second output is phase-shifted by an angle equal to 90°, the third output is phase-shifted by an angle equal to −90° and the last output is phase-shifted by an angle equal to 180°. The four signals obtained on the four output branches of the input matrix M1 are then amplified by way of a series of tube amplifiers A1,A2,A3,A4. The signals delivered by each of said tube amplifiers are then processed by an output matrix M2 whose transfer function is identical to that of the input matrix M1. At the output of the matrix M2, four amplified signals are available. In the case where a single signal is transmitted on the input E1 of the device, this signal is amplified by a factor of four on the output pathway $S_A4$, whereas the other three output pathways $S_A1$, $S_A2$, $S_A3$ deliver a signal of zero amplitude and phase, on account of the combinations of the four phase-shifted signals at the output of the input matrix M1.

This result is obtained in the case of a theoretical multi-port amplifier, that is to say an amplifier none of whose constituent elements exhibits any imperfection and all of which have notably a transfer function that is rigorously identical to that expected. In this case the signal transmitted on the input pathway E1 is amplified entirely on the output pathway $S_A4$ while the power delivered on the other output pathways is zero. The isolation of the pathway $S_A4$ in relation to the other pathways is therefore infinite.

In a real case, neither the input and output matrices, nor the tube amplifiers are ideal, thus resulting in finite isolation between the output pathways. In order to obtain sufficient isolation, it is necessary to correct the imperfections of the input and output Butler matrices and also to minimize the amplitude error and phase error at the input of the tube amplifiers. These errors are notably dependent on the effects of the temperature, the frequency band used and the aging of the device.

Figure 2:
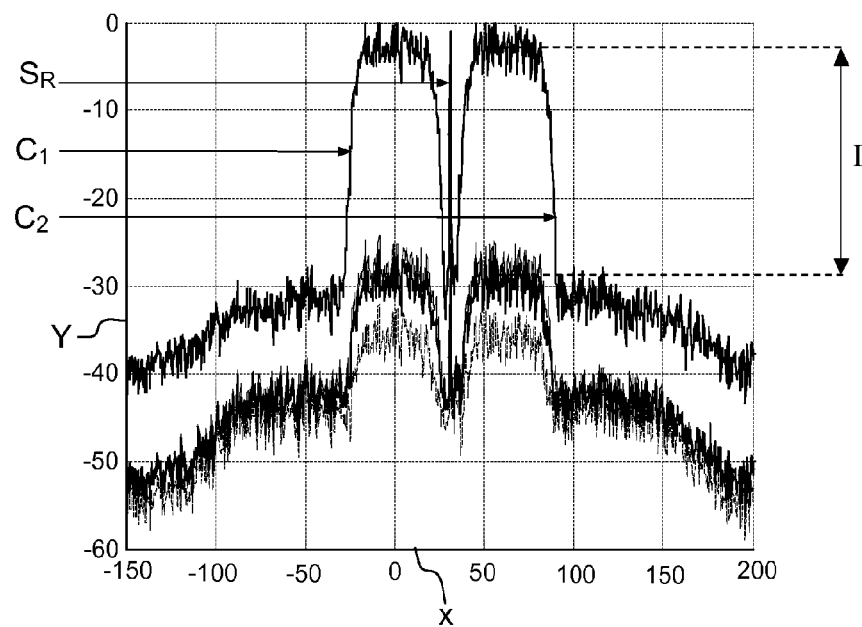

FIG. 2 illustrates an exemplary composite signal used as input to the device according to the invention with the aim of performing a compensation of the imperfections. The frequency spectrum of this signal is represented on a chart with abscissa X representing the frequencies in MHz and with ordinate Y representing the power spectral density in dBm per MHz.

One of the objectives of the invention is to compensate the multi-port amplifier without interrupting the communication. Accordingly, one solution consists in injecting an unmodulated reference signal $S_R$ transmitted on a single carrier frequency. The value of this carrier frequency is chosen in such a way that the reference signal $S_R$ is introduced between two communication channels $C_1$ and $C_2$ without impairing the performance thereof. In this way compensation of the imperfections of the device may be performed continuously, without interrupting the communications implemented.

The reference signal $S_R$ introduced serves to estimate the differential variations in phase and amplitude so as to thereafter compensate them upstream of the tube amplifiers. In FIG. 2 is also illustrated the isolation I of the communication signal $C_2$ at the output of the amplification device according to the invention. An isolation value I of greater than or equal to 25 decibels is acceptable for guaranteeing correct performance of the amplification device notably when it is used in a satellite communication system.

Figure 3:
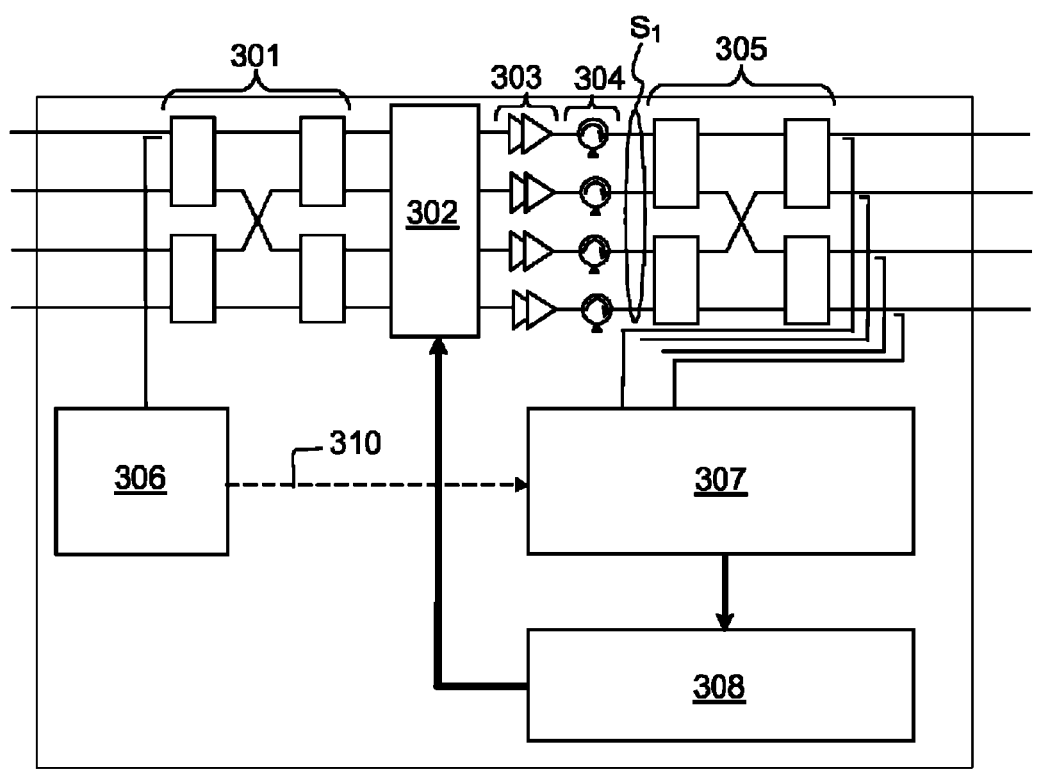

FIG. 3 shows diagrammatically a schematic of a self-compensated multi-port amplifier according to the invention. This amplifier is composed of an input matrix 301 comprising 4 input pathways and 4 hybrid couplers connected together so as to represent a Butler matrix. In a more general case, the input matrix 301 comprises N input and output pathways and (N/2)*M hybrid couplers, with $N=2^M$.

The outputs of the input matrix 301 are connected to a phase and amplitude compensation device 302 composed of attenuators and of phase shifters and which is inserted upstream of a chain 303 of tube amplifiers the function of which is to amplify the signal of each pathway. Each tube amplifier is connected to a power isolator 304 which makes it possible notably to protect the tube amplifiers 303. Each power isolator 304 is thereafter connected to one of the inputs of an output matrix 305 whose transfer function is identical to that of the previous input matrix 301. This output matrix 305 is also composed of hybrid couplers and produces as output N amplified signals.

Upstream of the system, a signal generator 306 produces a reference signal, for example a signal with pure carrier frequency, which is transmitted on the first input port of the device. The signals delivered on the N output pathways are thereafter extracted by a measurement device 307 which separates the reference signal from the communication signals and performs an estimation of the amplitude error and phase error in the reference signal, doing so for each of the output pathways. These amplitude error and phase error measurements are stored in a memory in matrix form and then a signal processing device 308 utilizes these measurements with the aim of producing a correction in phase and amplitude which is applied retroactively by the compensation device. The measurement device is previously calibrated so as to actually produce a zero phase error and zero amplitude error when the signal extracted at output is identical to the reference signal generated at input.

In a variant embodiment for which the multi-port amplifier according to the invention is embedded onboard a satellite in orbit, the signal processing device 308 may be implemented in a ground facility. In this case, the amplitude and phase error measurements extracted are transmitted to the ground by way of a telemetry downlink, and the corrections generated by the signal processing device are thereafter transmitted aboard the satellite by way of a remote control uplink.

Figure 3A:
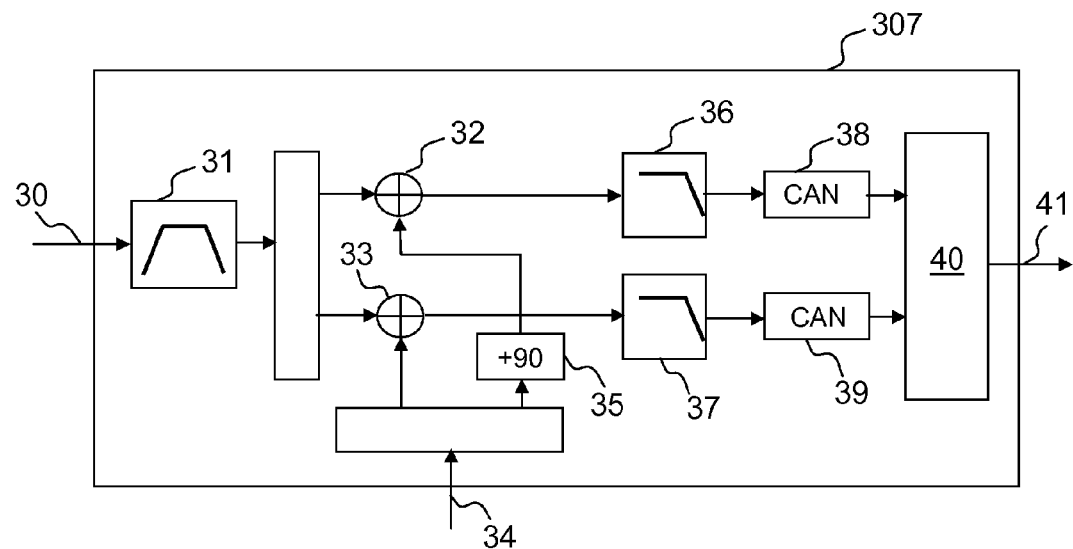

In the case where the reference signal injected at the input of the system is a sinusoidal signal whose frequency spectrum is a pure frequency such as illustrated in FIG. 2, the function of the measurement device 307 is the detection of amplitude and of phase of this reference signal which is transmitted simultaneously with the communication signal. A possible solution for carrying out this amplitude and phase detection consists in implementing a coherent demodulation of the composite signal such as shown diagrammatically with the support of FIG. 3a.

A vector 30 comprising the measurements of signal delivered on the N output pathways of the amplifier according to the invention is provided as input to the measurement device 307. For each component of the vector 30, a bandpass filtering 31 is applied so as to extract the reference signal from the useful signal. The filtered signal is thereafter correlated 32,33 with the reference signal 34 and the reference signal phase-shifted by 90° 35. The two correlated signals obtained are filtered by means of a low-pass filter 36,37 and then an analog digital conversion 38,39 is applied so as to provide the in-phase pathway I and quadrature pathway Q to a calculation module 40 which determines the errors in the amplitude A= $\sqrt{I^2+Q^2}$ and in the phase $$\Phi = \arg\left(\frac{Q}{I}\right)$$

for each of the output pathways of the amplifier. The amplitude error and phase error measurements 41 are thereafter delivered to the signal processing device 308.

Other implementations of the measurement device 307 are possible knowing that its technical function consists in extracting the reference signal from the useful signal and then estimating the amplitude and the phase which have impacted the reference signal after it has passed through the various component stages of the amplification device according to the invention.

Figure 3B:
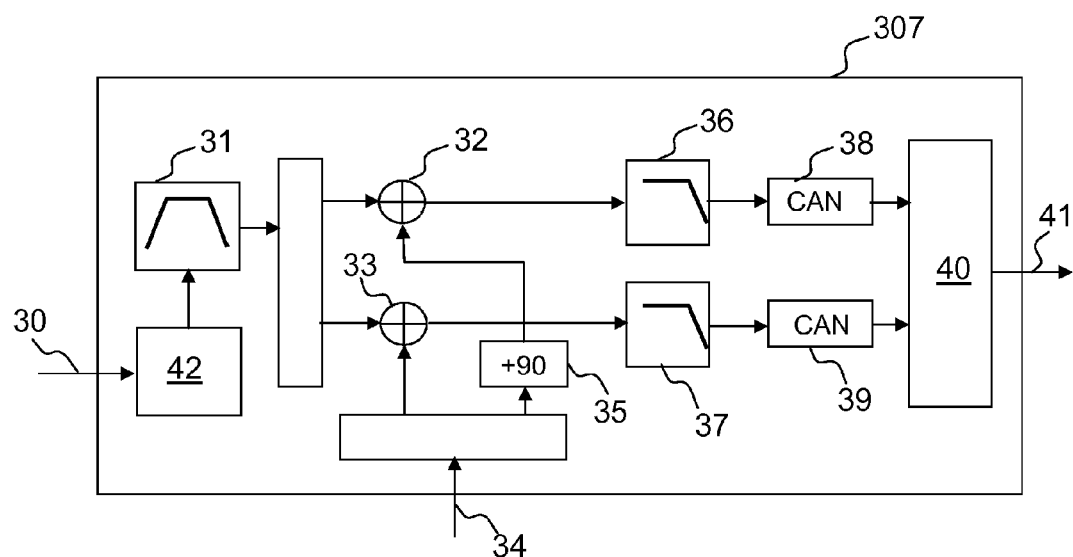

In a variant embodiment of the invention, the reference signal 310 is spread spectrally with the aid of a spreading code. In this case, the measurement device 307 includes in addition to the elements previously described a module 42 for despreading the signal received on the basis of the spreading code used which is provided by the generator 306. A schematic of a possible implementation of such a device 307 is represented in FIG. 3b. The despreading of the signal can be done by a scheme known to the person skilled in the art with the aim of extracting the reference signal from the useful signal, so as thereafter to estimate its amplitude and its phase. The benefit in using a spread-spectrum signal resides in the fact that such a signal is more discrete and exhibits an energy which is spread throughout the frequency band used.

One of the essential characteristics of the present invention resides in the determination of the corrections 302 in phase and amplitude which are determined by the signal processing device 308 on the basis of the amplitude and phase measurements obtained, for each output pathway, by the measurement device 307.

The constituent elements of the amplifier system according to the invention may be modeled on the basis of the following quantities.

The input matrix 301 is defined by its matrix response denoted $MB_1$. In the most general case, the matrix $MB_1$ possesses N rows and N columns where N is the number of input ports of the system. The integer N is preferably equal to a power of 2, $N=2^p$ with p a positive integer strictly greater than 0. This matrix is obtained, for example, by measurement.

In a similar manner, the output matrix 305 is defined by its matrix response $MB_2$ which also possesses N rows and N columns.

The phase/amplitude compensation device 302 is modeled by the $$D_{A-\Phi} = \begin{pmatrix} a_1 e^{j\Phi_1} & 0 & 0 & 0 \\ 0 & a_2 e^{j\Phi_2} & 0 & 0 \\ 0 & 0 & a_3 e^{j\Phi_3} & 0 \\ 0 & 0 & 0 & a_4 e^{j\Phi_4} \end{pmatrix},$$

in the case where N=4, with $a_i$ the amplitude compensation and $\Phi_i$ the phase compensation applied to each pathway by the device 302 upstream of the chain of amplifiers 303, i varying from 1 to N.

In a similar manner, the influence of the amplifiers 303 may be modeled with the aid of the matrix $$D_{Ampli} = \begin{pmatrix} G_1 & 0 & 0 & 0 \\ 0 & G_2 & 0 & 0 \\ 0 & 0 & G_3 & 0 \\ 0 & 0 & 0 & G_4 \end{pmatrix}$$

in the case where N=4, with $G_i$ the gain of each amplifier for i varying from 1 to N.

In the subsequent description, reference will be made to the various signals taken at distinct points of the device with the aid of the following notation. Each variable is a vector with N components which each correspond to the signal on one of the N pathways of the device.

$$E = \begin{pmatrix} e \\ 0 \\ 0 \\ 0 \end{pmatrix}$$

denotes the reference signal injected on input port number 1 of the device.

$E_1 = MB_1.E$ denotes the signal obtained at the output of the input matrix 301.

$E_2 = D_{A-\Phi}.MB_1.E$ denotes the signal obtained at the output of the phase/amplitude compensation device 302.

$S_1 = D_{Ampli}.E_2$ denotes the signal obtained at the output of the chain of amplifiers 303 after extraction of the reference signal and of the useful signal by the measurement device 307.

Finally, $S = MB_2.S_1$ denotes the signal obtained at the output of the output matrix 305.

The measurement device 307 delivers at its output a measurement of the amplitude and of the phase of the reference signal on each output pathway. These measurements make it possible to create the vector S.

On the basis of the previous relations, the following relation is deduced:

$$S_1 = D_{Ampli} D_{A-\Phi} MB_1 E \qquad (1)$$

With $S_1 = MB_2^{-1}.S$

And from this is deduced the following relation which connects the vector $S_1$ to the other variables of the system.

$$S_1 = \begin{pmatrix} S_1^1 \\ S_1^2 \\ S_1^3 \\ S_1^4 \end{pmatrix} = \begin{pmatrix} e \cdot G_1 \cdot a_1 e^{j\Phi_1} \cdot MB_1^{1,1} \\ e \cdot G_2 \cdot a_2 e^{j\Phi_2} \cdot MB_1^{2,1} \\ e \cdot G_3 \cdot a_3 e^{j\Phi_3} \cdot MB_1^{3,1} \\ e \cdot G_4 \cdot a_4 e^{j\Phi_4} \cdot MB_1^{4,1} \end{pmatrix} \qquad (2)$$

Where $MB_1^{1,1}$, $MB_1^{2,1}$, $MB_1^{3,1}$, $MB_1^{4,1}$ are the components of the first row of the matrix $MB_1$.

Finally, relation (3) is arrived at, which makes it possible to determine, for any i varying from 1 to N (N=4 in our example), the complex gains of each amplifier:

$$G_i = \frac{S_1^i}{e \cdot MB_1^i \cdot a_i \cdot e^{j\Phi_i}} \qquad (3)$$

The vector $S_1$ is calculated on the basis of the vector S obtained by measurements and of the output matrix $MB_2$.

The reference signal e is known to the user, as is the input matrix $MB_1$.

The values of the amplitude setpoint and phase setpoint (matrix $D_{A-\Phi}$) are initialized at the start of the method to given initial values, $a^0_i$ and $\Phi^0_i$.

The method according to the invention thereafter consists in determining at various instants of temporal sampling new values $a'_i$ and $\Phi'_i$ of amplitude/phase setpoint so as to correct the system isolation defects.

One of the objectives of the self-compensation in phase and amplitude of the system according to the invention is to correct the imperfections of the amplifier chain modeled by the matrix $D_{Ampli}$. In order that the system be as close as possible to theory and that the isolation between each output pathway be as optimal as possible, it is necessary for each of the amplifiers 303 used on each of the pathways of the system to exhibit the same response in terms of amplitude and phase. This condition is equivalent to a modeling of the system which satisfies the following relation:

$$D_{A\text{-}\Phi} \cdot D_{Ampli} = G \cdot I_d \quad (4)$$

Where G is a complex gain and $I_d$ the identity matrix.

Relation (4) translates the compensation by the device 302 modeled by the matrix $D_{A\text{-}\Phi}$ of the imperfections of the chain of amplifiers 303 modeled by the matrix $D_{Ampli}$ in such a way as to obtain an identical complex gain on each pathway; one speaks of iso-length of the N paths making up the device.

To obtain this result, a reference pathway should initially be chosen from among the N possible pathways. By default the pathway of index 1 is taken as reference pathway, the gain $G_i$ of the amplifiers of the other N−1 pathways should then be compensated by the difference in gain $G_1$ between each pathway of index i and the reference pathway.

The reference pathway may be taken equal to any pathway. The compensation of the gains of the amplifiers can also be performed with respect to a virtual reference whose gain corresponds to the average of the gains of all the pathways, to the minimum or to the maximum of the gains over the whole set of pathways.

Therefore, the following quantities are calculated, for i varying from 2 to N:

$$\Delta Z_{1,i} = (a_i + |G_i|) - (a_1 + |G_1|) \quad (5)$$

where all the terms of the relation are expressed in decibels, and | | denotes the modulus of a complex number, and $$\Delta \Phi_{1,i} = (\Phi_i + arg(G_i)) - (\Phi_1 + arg(G_1)) \quad (6)$$

where all the terms of the relation are expressed in degrees and arg( ) denotes the argument of a complex number.

The amplitude/phase self-compensation of the system must culminate in a complex gain, that is to say an amplitude and a phase, that is identical on each pathway at the output of the chain of amplifiers 303.

Figure 4A:
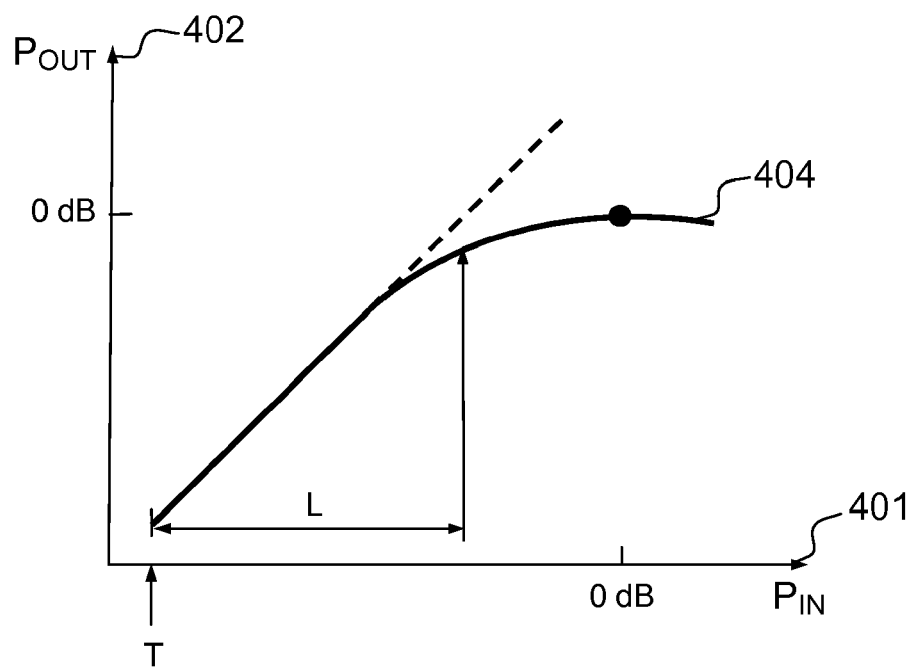
Figure 4B:
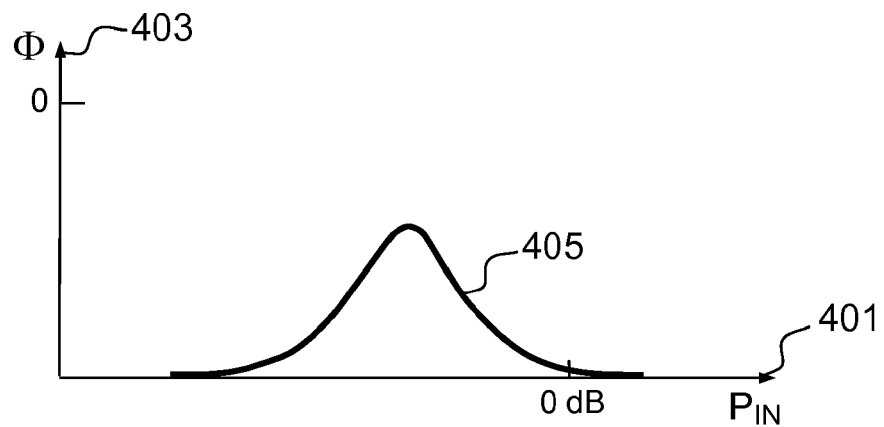

Accordingly, the non-linearity of said amplifiers needs to be taken into account. Indeed, the amplitude, respectively the phase, at the output of an amplifier is not necessarily proportional to the amplitude, respectively the phase, at the input of the same amplifier. In practice an amplifier i exhibits a first transfer function $f^i_{AM,AM}$ which connects the amplitude of the input signal to the amplitude of the output signal, and a second transfer function $f^i_{AM,PM}$ which connects the phase of the input signal to the amplitude of the output signal. An example of such transfer functions is illustrated with the support of FIGS. 4a and 4b. The curve 404 represents the variation of the power of the output signal 402 as a function of that of the input signal 401. The region L of the curve 404 is linear while the remainder of the curve is not. Likewise the curve 405 represents the variation of the phase of the output signal 403 as a function of the power of the input signal 401.

The amplitude $IBO_i$ of the signal at the input of the amplifier of the pathway of index i, which is connected to the amplitude $OBO_i$ of the signal at the output of the same amplifier, is then introduced through the following relation:

$$IBO_i = f^i_{AM,AM}(OBO_i) \quad (7)$$

and the phase of the signal at the input of the same amplifier is given by the relation:

$$\Theta_i = f^i_{AM,PM}(OBO_i) = arg(G_i) \quad (8)$$

The value of the signal at the output of the amplifier is obtained on the basis of the component i of the vector $S_1$ introduced previously.

It is then sought to compensate the amplitude of the output signal of each amplifier by the quantity $\Delta Z_{1,i}$ obtained in relation (5) so as to obtain a new value $OBO'_i = OBO_i - \Delta Z_{1,i}$ of the amplitude of the output signal.

The new amplitudes and phase of the input signal of the amplifier are thereafter calculated with the aid of the following relations:

$$IBO'_i = f^i_{AM,AM}(OBO'_i)$$

$$\Theta'_i = f^i_{AM,PM}(OBO'_i) \quad (9)$$

Finally the last calculation step makes it possible to obtain the new values of amplitude and phase setpoint that the calculation device 308 provides to the compensation device 302 at a later instant:

$$a'_i = a_i + IBO'_i - IBO_i$$

$$\Phi'_i = \Phi_i - \Delta\Phi_{1,i} - (\Theta'_i - \Theta_i) \quad (10)$$

In a variant embodiment of the invention, the tube amplifiers 303 may be replaced with solid-state power amplifiers, known by the abbreviation SSPA.

Another variant embodiment of the invention is now described for which the knowledge of the input matrix $MB_1$, output matrix $MB_2$ and the matrix $D_{Ampli}$ modeling the influence of the amplifiers 303 is not necessary.

Referring to relations (1), (2) and (3) introduced hereinabove, it is noted that the self-compensated system according to the invention requires the knowledge of the matrices $MB_1$ and $MB_2$ as well as the calculation (according to relation (3)) of the matrix $D_{Ampli}$. This a priori knowledge involves a measurement, by external means, of the responses of the input Butler matrix and output Butler matrix so as to model their real influence which may differ from the theoretical Butler matrices on account of their production-related imperfections.

The real matrix response $MB_1$ of the input Butler matrix may be decomposed as the product of two terms $MB_1 = M_1^{error} \cdot MB_1^{th}$, where $MB_1^{th}$ is the theoretical input Butler matrix and $M_1^{error}$ is the diagonal matrix comprising the errors or differences between the theoretical matrix and the real matrix. In the same manner, it is possible to write for the output matrix of the system $MB_2 = MB_2^{th} \cdot M_2^{error}$ By taking into account the imperfections of the Butler matrices and through analogous reasoning to that described previously with the support of relation (4), this time it is sought to render the N paths passing through the power amplifiers between each theoretical Butler matrix iso-length. This condition is equivalent to a modeling of the system which satisfies the following relation, with G a complex gain and $I_d$ the identity matrix:

$$M_2^{error} \cdot D_{A\text{-}\Phi} \cdot D_{Ampli} \cdot M_1^{error} = G \cdot I_d \quad (11)$$

The amplitude setpoint $a_i$ and phase setpoint $\Phi_i$ determined by the calculation device 308 and transmitted to the compensation device 302 are thereafter determined in an analogous manner to the reasoning described previously with the support of relations (3) and (5) to (10) with the exception that the corrective terms $a_i e^{j\Phi_i}$ making up the diagonal matrix $D_{A\text{-}\Phi}$ also integrate the imperfections related to the diagonal error matrices $M_1^{error}$ and $M_2^{error}$. The relations making it possible to determine the complex gains $G_i$ of each amplifier, in particular relation (3) and the relation connecting the intermediate vector $S_1$ and the output vector $S$, are used with the theoretical matrices $MB_1^{th}$ and $MB_2^{th}$ rather than the real ones.

In another aspect of the invention, the characteristics $f_{AM,AM}{}^i$ and $f_{AM,PM}{}^i$ of the amplifiers of each pathway need no longer be taken into account. The amplitude compensation $a'_i$ is determined directly on the basis of the output amplitude value $OBO'_i$ of each amplifier through the relation:

$$a'_i = a_i + \eta(OBO'_i - OBO_i) \qquad (12)$$

with $\eta$ a multiplicative coefficient less than 1 in absolute value.

This simplification makes it possible to circumvent the knowledge of the precise characteristic $f_{AM,AM}{}^i$ of each amplifier while ensuring convergence of the calculations to a finite limit value in a reasonable time.

Moreover the phase compensation $\Phi'_i$ may be determined through the following relation:

$$\Phi'_i = \Phi_i - \Delta\Phi_{1,i} \qquad (13)$$

The phase correction determined according to relation (13) is intrinsically composed of two terms: a phase rotation introduced by the tube amplifier and dependent on its output power $OBO_i$ and a phase discrepancy due to the characteristics of the elements constituting each pathway of the MPA system. During the first iteration of the calculation, the second term is compensated and only the first term evolves as the iterations proceed. The total phase control, namely the sum of the successive corrections applied at each iteration, then tends to an increasingly stable value as the amplitude compensation converges. The phase compensation determined according to relation (13) taking no account of the phase response of each tube amplifier, this compensation is imperfect but nevertheless allows convergence to a limit value in a reasonable time.

Figure 5:
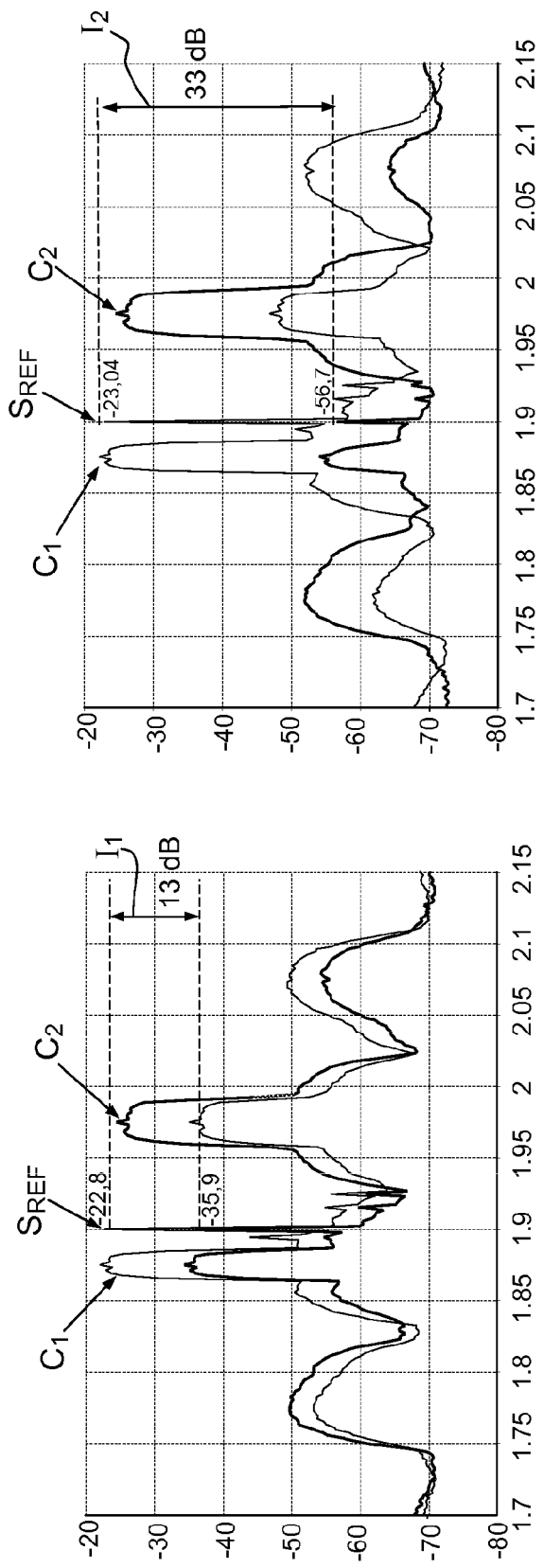

FIG. 5 illustrates the performance of the self-compensated system and the gain obtained as regards the isolation of the output pathways. The left part of the figure represents the reference signal $S_{REF}$, here a pure-carrier signal, inserted between two communication signals $C_1$ and $C_2$. In this figure is represented the isolation $I_1$ obtained between the amplified signal on the main pathway and the residual present on the secondary pathways. The isolation $I_1$ is of the order of 13 dB. The same composite signal is represented in the right part of the figure but in the case where the system has been self-compensated by the previously described method according to the invention. The isolation $I_2$ obtained is improved and this time is of the order of 33 dB.

In another variant embodiment of the invention, the phase and amplitude compensation is updated as soon as the isolation I measured on the reference signal is greater than a given threshold. One then speaks of adaptive structure to denote the principle which consists in adapting the compensations in terms of phase and amplitude in the course of time as a function of a given criterion. Adaptive compensation is notably necessary when the errors which impact the system evolves in the course of time as a function of the operating conditions. On the other hand, one speaks of static compensation when the latter is performed just once to correct a static error which does not evolve in the course of time.

The self-compensated multi-port amplification system according to the invention presents notably the main advantage of ensuring self-compensation in terms of phase and amplitude of the system in the presence of traffic, that is to say without interrupting transmission. It is particularly adapted to satellite transmission systems. In the assembly, integration and test (AIT) phase the invention affords an aid in the search for the optimal settings of the system so as to maximize performance. In the in-orbit test or utilization (IOT) phase the device is self-compensated automatically by way of the compensation loop which can act from a ground facility to an onboard facility or be situated entirely on board.

The main objective of the multi-distributed amplification system according to the invention is the self-compensation in terms of amplitude and phase of the intrinsic defects of the hardware components which constitute each amplification pathway so as to ensure maximum inter-pathway isolation.

Another application of the system according to the invention relates to the detection and location of a fault affecting a power amplification chain on one of the pathways of the system. Indeed, as explained previously, the invention makes it possible notably to determine the vector $S_1$ composed of the powers of the output signals of each chain of amplifiers 303 on each pathway. On the basis of this information, a detection threshold may be applied to each power of the vector $S_1$ so as to determine whether the estimated output power is abnormally low, which would result from an amplifier operating defect. The detection threshold is determined as a function of the power of the signal emitted and of the operating point aimed at by the application.

When a fault is located on one of the pathways of the amplification system according to the invention, a chain of amplifiers 303 may be replaced with a redundant chain provided for this purpose. A switching of the inputs and outputs of the defective chain of amplifiers to the redundant chain is then performed and a new isolation calculation according to the invention is carried out.

The invention claimed is:

1. A system for multi-distributed amplification of a communication signal, the system comprising:
    at least one plurality N of input pathways i connected to an input Butler matrix which delivers as output N distributed signals;
    a plurality N of amplifiers which receive as input said distributed signals and produce as output N amplified and phase-shifted signals each of a complex gain $G_i$;
    an output Butler matrix which receives as input said amplified signals and produces as output N output signals;
    a generator of a reference signal of known amplitude e and of known phase, said reference signal being provided on one of said input pathways of said system, said reference signal being transmitted simultaneously with said communication signal to be amplified;
    a device for measuring the errors S of amplitude and of phase of each of said output signals of said system, said device being suitable for performing a coherent demodulation of the amplified signal so as to extract said reference signal from said communication signal and to estimate said amplitude error and phase error impacting the reference signal;
    a signal processing device receiving as input said measurements S of the amplitude error and phase error, and producing, on the basis of said measurements S, for each pathway i of said system, an amplitude compensation $a'_i$ and phase compensation $\Phi'_i$, the aim of said compensation being to minimize the differences between the complex gain $G_i$ of the amplifier of each pathway i and the complex gain $G_1$ of the amplifier of a reference pathway from among the pathways of said system; and
    a phase/amplitude compensation device, inserted between said input Butler matrix and the plurality of amplifiers and suitable for correcting each of the pathways i of said system on the basis of the received values of amplitude compensation $a'_i$ and phase compensation $\Phi'_i$.

2. The system as claimed in claim 1, wherein said reference pathway is one of the pathways of the amplification system or a virtual pathway whose gain is equal to the average of the gains of the set of pathways of the amplification system or the pathway i exhibiting the lowest gain $G_i$ or the pathway i exhibiting the highest gain $G_i$.

3. The system as claimed in claim 1, wherein said reference signal is spread spectrally with the aid of a spreading code and said measurement device is adapted, in addition, to despread the signal received on the basis of said spreading code so as to separate the reference signal from the communication signal.

4. The system as claimed in claim 1, wherein the signal processing device determines the amplitude compensation $a'_i$ and phase compensation $\Phi'_i$ on the basis of at least the following calculation steps:

a step of calculating the complex gains $G_i$ on the basis of the following relation:

$$G_i = \frac{S_1^i}{e \cdot MB_1^i \cdot a_i \cdot e^{j\Phi_i}},$$

where $S_1^i$ is the component of index i of a vector $S_1 = MB_2^{-1} \cdot S$ with $MB_2^{-1}$ the inverse of the output Butler matrix, $MB_1^i$ is the component of index i of the first row of the input Butler matrix, $a_i$ and $\Phi_i$ are the amplitude and phase compensations obtained at an earlier instant;

a step of calculating the following quantities, for each pathway of index i, $\Delta Z_{1,i} = (a_i + |G_i|) - (a_1 + |G_1|)$ and $\Delta \Phi_{1,i} = (\Phi_i + \arg(G_i)) - (\Phi_1 + \arg(G_1))$, where | | denotes the modulus of a complex number and arg( ) denotes its phase, the index 1 denotes the reference pathway;

a step of calculating the amplitude $OBO_i$ of the signal at the output of each amplifier on the basis of said vector $S_1$;

a step of calculating the amplitude compensation $a'_i$, on each pathway i, at a later instant, on the basis of said quantity $\Delta Z_{1,i}$ and of the amplitude $OBO_i$ of the output signal of the amplifier of said pathway; and a step of calculating the phase compensation $\Phi'_i$ on each pathway i, at a later instant, on the basis of said quantity $\Delta \Phi_{1,i}$ according to the relation $\Phi'_i = \Phi_i - \Delta \Phi_{1,i}$.

5. The system as claimed in claim 1, wherein the amplitude compensation $a'_i$ is determined at least with the aid of the following relations:

$a'_i = a_i + IBO'_i - IBO_i$ where $IBO_i = f_{AM,AM}^i(OBO_i)$, $OBO'_i = OBO_i - \Delta Z_{1,i}$ and $IBO'_i = f_{AM,AM}^i(OBO'_i)$, with $f^i_{AM,AM}$ the transfer function of the amplifier of the pathway i which connects the input amplitude and output amplitude.

6. The system as claimed in claim 1, wherein the amplitude compensation $a'_i$ is determined at least with the aid of the following relation:

$a'_i = a_i + \eta(OBO'_i - OBO_i)$ with $\eta$ a multiplicative coefficient less than 1 in absolute value and $OBO'_i = OBO_i - \Delta Z_{1,i}$.

7. The system as claimed in claim 1, wherein the phase compensation $\Phi'_i$ is determined furthermore on the basis of the following relations:

$\Theta_i = f_{AM,PM}^i(OBO_i)$ $\Theta'_i = f_{AM,PM}^i(OBO'_i)$ $\Phi'_i = \Phi_i - \Delta \Phi_{1,i} - (\Theta'_i - \Theta_i)$ where $f^i_{AM,PM}$ is the transfer function of the amplifier of the pathway i which connects the input phase to the output amplitude.

8. The system as claimed in claim 1, wherein said input Butler matrix and output Butler matrix are composed of a plurality of hybrid couplers connected together.

9. The system as claimed in claim 1, wherein said matrices $MB_1$ and $MB_2$ are obtained on the basis of measurements of the transfer functions of the input Butler matrix and output Butler matrix or on the basis of the theoretical transfer functions of the input Butler matrix and output Butler matrix.

10. The system as claimed in claim 1, wherein said measurement device is adapted, in addition, for measuring the isolation I between the reference pathway and the other output pathways of said system and that a new amplitude compensation $a'_i$ and phase compensation $\Phi'_i$ is determined in an adaptive manner as soon as the value of the isolation I exceeds a given threshold.

11. The system as claimed in claim 1, wherein said amplifiers are tube amplifiers or solid-state amplifiers.

12. The system as claimed in claim 1 for use in a satellite communication system, wherein said signal processing device is remotely sited in a ground facility and communicates with said system situated in an onboard facility by way of a remote control link and/or of a telemetry link.

13. A method of use of the system as claimed in claim 1 for detecting defects of the amplifiers of one of said pathways i of the system, wherein the components of a vector $S_1 = MB_2^{-1} \cdot S$ are compared with a given threshold so as to detect a significant decline in power at the output of one of said amplifiers and to replace the defective amplifier.

* * * * *